(12) United States Patent
Iguchi et al.

(10) Patent No.: US 7,370,746 B2
(45) Date of Patent: May 13, 2008

(54) BALL TRANSFER UNIT AND BALL TABLE

(75) Inventors: Kaoru Iguchi, Tokyo (JP); Masakazu Takahashi, Tochigi (JP)

(73) Assignees: E.I. du Pont de Nemours and Company, Wilmington, DE (US); Iguchi Kiko Co., Ltd., Tokyo (JP)

( * ) Notice: Subject to any disclaimer, the term of this patent is extended or adjusted under 35 U.S.C. 154(b) by 0 days.

(21) Appl. No.: 10/561,568

(22) PCT Filed: Jul. 1, 2004

(86) PCT No.: PCT/JP2004/009672

§ 371 (c)(1),
(2), (4) Date: May 10, 2006

(87) PCT Pub. No.: WO2005/003001

PCT Pub. Date: Jan. 13, 2005

(65) Prior Publication Data

US 2007/0029158 A1 Feb. 8, 2007

(30) Foreign Application Priority Data

Jul. 1, 2003 (JP) .............................. 2003-270186

(51) Int. Cl.
B35G 13/00 (2006.01)
(52) U.S. Cl. .............................. 193/35 MD; 193/35 R
(58) Field of Classification Search .......... 193/35 MD, 193/35 R, 37
See application file for complete search history.

(56) References Cited

U.S. PATENT DOCUMENTS 4,871,052 A * 10/1989 Huber ................... 193/35 MD
5,533,604 A *  7/1996 Brierton ................ 193/35 MD
6,279,716 B1 *  8/2001 Kayatani et al. ....... 193/35 MD
6,814,212 B1 * 11/2004 Ebersole ................... 193/35 R

* cited by examiner

Primary Examiner—James R. Bidwell

(57) ABSTRACT

A ball transfer unit comprising a body in a seat face recessed in a semispherical shape is formed, a plurality of small balls rollingly in contact with the seat face of the body, a large ball rollingly in contact with the plurality of small balls, and a cover fitted to the body to hold the large ball and hold the small balls between the large ball and the seat face of the body. At least the body and the large ball are formed of either of PAI, PBI, PCTFE, PEEK, PEI, PI, PPs, melamine resin, aromatic polyamide resin, aluminum oxide, zirconium oxide, and silicon nitride.

10 Claims, 2 Drawing Sheets

BALL TRANSFER UNIT AND BALL TABLE

TECHNICAL FIELD

The present invention pertains to a ball table, which can support a transported material in such a way that the transported material can displace in any direction along its transport surface, and pertains to a ball transfer unit used for said ball table.

BACKGROUND OF THE INVENTION

A ball table having multiple ball transfer units arranged on a fixed disk or other support part is used to correct the transport position of a transported material on its transport path or to change the transport direction to the perpendicular direction. The ball transfer unit assembled in such a ball table has a main body having a seat surface recessed in a semispherical shape, multiple small balls rollingly in contact with the seat surface of the main body, a large ball rollingly in contact with the multiple small balls, and a cover installed on the main body to hold the large ball and to hold small balls between the large ball and the seat surface of the main body. In the aforementioned ball transfer unit, when the large ball rolls and the small balls having contact with the large ball and the seat surface of the main body roll between them along with movement of the transported material carried on the large ball, the static friction resistance between the transported material and the large ball can be reduced to a very low level.

Consequently, the transported material can be easily displaced with respect to external force in any direction on the transport surface of the transported material on the ball table. The transport position of the transported material can be corrected very easily on its transport path. For example, U.S. Pat. No. 2,641,187 disclosed the following technology. In this case, the side end acting as the positioning reference for automobile window glass with a large weight or other material transported on a ball table is pressed by an actuator against a positioning reference block fixed with respect to the ball table. In this way, the transport position of the transported material is corrected.

Japanese Kokai Patent Application No. Hei 7[1995]-164078 discloses a ball transfer unit, which is made of a plastic that is softer than metal to prevent scratches from forming on the surface of metal plates transported thereon, and is also self-lubricating to prevent lubricant from adhering to the metal plates.

For a production line used to form a circuit on a semiconductor wafer or a production line for a flat panel display, when transporting a semiconductor wafer or glass substrate, it is necessary to determine their positions in each specific step. The ball table can be used for such a positioning operation. When transporting a semiconductor wafer or a glass substrate for a flat panel display, it is necessary to prevent damage to the surface caused by friction and the attachment of foreign matter. Even if foreign matter is attached, it is necessary to make sure that it can be easily removed by means of washing.

In consideration of the aforementioned point of view, the conventional technologies disclosed in U.S. Pat. No. 2,641, 187 and Japanese Kokai Patent Application No. Hei 7[1995]-164078 have problems because these technologies will cause damage to the surface of the transported material, or will attach foreign matter that will cause defects in the transported material, or will attach foreign matter that cannot be removed by means of washing in a later step. For example, when the main body or the large ball is made of stainless steel or other metal, the metal powder generated as a result of abrasion will cause damage to the surface of the transported material or will be attached as foreign matter that cannot be removed by means of washing in a later step on the surface of the transported material. In the ball transfer unit made of polyurethane or polyacetal used in patent reference 2, the resin powder generated as a result of abrasion is fixed as clear traces on the surface of the transported material, which makes the washing operation in a later step very difficult.

SUMMARY OF THE INVENTION

Briefly stated, and in accordance with one aspect of the present invention, there is provided a ball transfer unit comprising:

a) a main body having a seat surface recessed in a semispherical shape;
b) a plurality of small balls which are each in freely rolling contact with the seat surface of the main body,
c) a large ball which is in freely rolling contact with the plurality of small balls, and
d) a cover which is attached to the main body and is adapted for holding the large ball and for holding the small balls between the large ball and the seat surface of the main body;

wherein at least the main body and the large ball are made of a material selected from among PAI, PBI, PCTFE, PEEK, PEI, PI, PPS, melamine resins, aromatic polyamide resins, aluminum oxide, zirconium oxide and silicon nitride.

Pursuant to another aspect of the present invention, a ball table used for supporting a transported material, the ball table being comprised of a plurality of ball transfer units as described above and a supporting member in which the ball transfer units are fixed at predetermined intervals.

BRIEF DESCRIPTION OF THE DRAWINGS

The invention will be more fully understood from the following detailed description, taken in connection with the accompanying drawings, in which.

Figure 1:
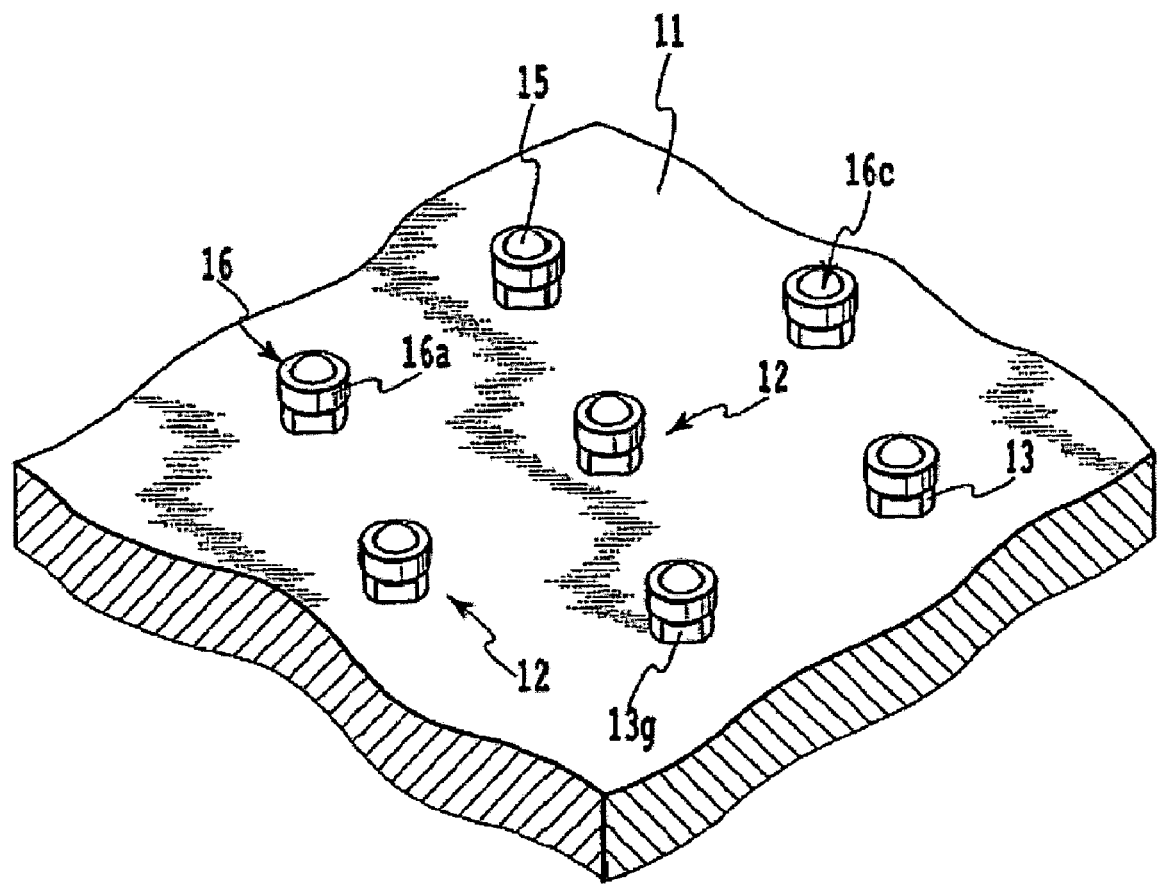
FIG. 1 is a fragmentary perspective view showing an embodiment of the ball table according to the invention.

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

The objective of the present invention is to provide a ball transfer unit that does not cause damage to the surface of the transported material, or cause defects on the transported material itself, or generate foreign matter that cannot be removed by means of washing in a later step. It is also to provide a ball table using said ball transfer unit.

The first embodiment of the present invention for realizing the aforementioned objective provides a ball transfer unit characterized by the following facts: the ball transfer unit has a main body having a seat surface recessed in a semispherical shape, multiple small balls rollingly in contact with the seat surface of the main body, a large ball rollingly in contact with the multiple small balls, and a cover installed on the main body to hold the large ball and to hold small balls between the large ball and the seat surface of the main body; at least the aforementioned main body and the aforementioned large ball are made of any material selected from PAI (polyamide imide), PBI (polybenzimidazole), PCTFE (polychlorotrifluoroethylene), PEEK (polyether ether ketone), PEI (polyether imide), PI (polyimide), PPS (polyphenylene sulfide), melamine resin, aromatic polyamide resin (aramide resin), aluminum oxide, zirconium oxide, and silicon nitride.

In the present invention, when external force is applied to the transported material carried on the large ball, the large ball rolls along with the displacement of the transported material; the small balls that support the large ball also roll with respect to the seat material of the main body to minimize the frictional resistance with respect to movement of the transported material.

For the ball transfer unit of the present invention, since at least the main body and the large ball are made of any material selected from PAI, PBI PCTFE, PEEK, PEI, PI, PPS, melamine resin, aromatic polyamide resin, aluminum oxide, zirconium oxide, and silicon nitride, the frictional resistance against movement of the transported material carried on the large ball can be minimized, and the transported material can be displaced by applying a small external force. In this case, abrasion abrasive powder is difficult to generate along with rolling of the large ball and the small balls. Even if abrasion powder is generated and attaches in traces to the transported material, it can be easily washed off. Consequently, the adverse effect can be prevented before it occurs when processing a semiconductor wafer or manufacturing flat panel display. Also, excellent resistance against UV light or chemical resistance can be obtained.

In the ball transfer unit disclosed in the first embodiment of the present invention, the Rockwell hardness $H_RR$ (R scale) of the main body, small balls, and large ball is preferred to be 75 or larger. If the Rockwell hardness $H_RR$ of these parts is less than 75, the large ball or the seat surface of the main body may undergo elastic deformation under the weight, etc., of the transported material carried on the large ball. The frictional resistance will be increased when the transported material is moved from a static state, to hinder the smooth movement of the transported material. In particular, there is a high possibility of causing damage to the surface of the large ball or having foreign matter attached to the surface of the large ball.

When the Rockwell hardness $H_RR$ of the main body, small balls, and large ball is set to 75 or higher, elastic deformation of the large ball or the seat surface of the main body caused by the weight of the transported material carried on the large ball can be restrained. The frictional resistance can be minimized when the transported material is moved from a static state so that the transported material can move very smoothly.

Similarly, the thermal deformation temperatures of the main body, small balls, and large ball measured according to test ASTM D648 should be 120° C. or higher. If the thermal deformation temperatures are lower than 120° C., when the transported material has a relatively high temperature or is used in an atmosphere with a high environmental temperature, the large ball or the seat surface of the main body may be deformed. The frictional resistance will be increased when the transported material is moved [transformed] from a static state. As a result, smooth movement of the transported material is hindered.

When the thermal deformation temperatures of the main body, small balls, and large ball measured according to test ASTM D648 are set to 120° C. or higher, when the transported material has a relatively high temperature or is used in an atmosphere with a high environmental temperature, deformation of the large ball or the seat surface of the main body can be restrained. The frictional resistance can be minimized when the transported material is moved from a static state so that the transported material can be moved very smoothly.

Said PAI, PBI, PCTFE, PEEK, PEI, PI, PPS, melamine resin, and aromatic polyamide resin all have Rockwell hardness $H_RR$ levels of 75 or larger and thermal deformation temperatures measured, according to test standard ASTM D648, of 120° C. or higher. Of course, aluminum oxide, zirconium oxide, and silicon nitride are harder and have better heat resistance than the aforementioned resins.

The small balls can be made of the same material used for the main body or the large ball. The small balls can also be made of a stainless steel, such as SUS304, SUS316, SUS420j2, SUS440C, or wet surface-treated (chemical grinding and surface washing) SUS304 and SUS316. If the small balls are made of stainless steel, it is preferred to form the main body and the large ball using PAI, PBI, PCTFE, PEEK, PEI, PI, PPS, melamine resin, or aromatic polyamide resin.

If the small balls are made of the same material of the aforementioned main body or large ball, since there is no metal powder generated by abrasion from the ball transfer unit at all, the adverse effect can be prevented before it occurs during processing of a semiconductor wafer or the manufacture of a flat panel display.

The ball transfer unit can be made of a single material so that foreign matter can be treated more easily. Also, when PBI, PEEK, or PI is selected as the single material, particularly good results can be obtained when using the ball transfer unit in pretreatment devices for a liquid-crystal panel substrate glass, such as an exposure device, plasma dry etcher, vacuum chamber in a sputtering device, or heating oven, or at a place exposed to chemicals or when using the ball transfer unit during the cutting of glass or laser repair for correction after examination.

The main body also has an annular groove on its outer peripheral surface. The cover has a cylindrical part fit to encircle the outer peripheral surface of the main body and an annular securing part, which is capable of elastic deformation in the radial direction and is formed on the inner circle at the bottom of the cylindrical part to fit in the annular groove. The internal diameter of the securing part is set to be smaller than the outer diameter of the main body. In this case, the cover is made of PAI, PBI, PCTFE, PEEK, PEI, PI, PPS, melamine resin, or aromatic polyamide resin.

The annular groove is formed on the outer peripheral surface of the main body. The cylindrical part fit to encircle the outer peripheral surface of the main body and the annular securing part, which is capable of elastic deformation in the radial direction and is formed on the inner circle at the bottom of the cylindrical part to fit in the annular groove, are formed on the cover. The internal diameter of the securing part is set to be smaller than the outer diameter of the main body. In this way, the cover can be snapped on the main body. The generation of foreign matter can be prevented when fixing the cover on the main body. In particular, the reliability can be guaranteed when using the ball transfer unit in a clean room. From this point of view, the ball transfer unit should be washed clean-packed immediately after it is manufactured; the package can be opened in a clean room in order to use the ball transfer unit. More specifically, a freshly manufactured ball transfer unit is pre-washed with IPA (isopropyl alcohol) or a surfactant to remove the grease and foreign matter from its surface. Next, the pre-washed ball transfer unit is placed in a supersonic washing tank containing pure water doped with a surfactant. After the ball transfer unit is heated to an appropriate temperature and washed supersonically, it is rinsed and washed with pure water in multiple stages, followed by drying the water with clean air. After that, the washed ball transfer unit is heated to be dried in a dry room and is clean-packed using a prescribed packing material. In this way, a cleaning degree up to class 10, for example, can be guaranteed for the ball transfer unit.

It is also possible to form a through hole, which penetrates through the main body and has one end opened on the seat surface. It is preferred to set the internal diameter of the opening part of the through hole smaller than the radius of the small balls so that rolling of the small balls along the seat surface will not be hindered.

If a through hole, which penetrates through the main body and has one end opened on the seat surface, is formed, when the ball transfer unit is used in a vacuum chamber, the air in the ball transfer unit can be removed easily and quickly because of the through hole. The washing solution flowing into the ball transfer unit when washing the transported material can also be easily discharged to the outside via the through hole.

A female screw cylinder or male screw part used for fixing the main body or installation flange or other fastening part can also be formed integrally with the main body.

The second embodiment of the present invention provides a ball table that is used to support a transported material and has multiple ball transfer units disclosed in the first embodiment of the present invention, along with a support part with which the ball transfer units are fixed at prescribed intervals.

In the present invention, when external force in parallel with the surface of the support part is applied to the transported material carried on the support part via the ball transfer units, the large ball of each of the ball transfer unit rolls along with the displacement of the transported material, with the small balls supporting the large ball all roll with respect to the seat surface of each main body. The frictional resistance against movement of the transported material can be minimized.

Since the ball table of the present invention has multiple ball transfer units disclosed in the present invention and a support part with which the ball transfer units are fixed at prescribed intervals, the frictional resistance against movement of the transported material carried on the support part across said ball transfer units can be minimized, and the transported material can be displaced on said support part by applying a small external force. In this case, abrasion powder is difficult to generate along with rolling of the large ball and the small balls. Even if abrasion powder is generated and attaches as traces to the transported material, it can be easily washed off. Consequently, the adverse effect can be prevented before it occurs when processing a semiconductor wafer or when manufacturing a flat panel display. Also, excellent resistance against UV light or chemical resistance can be obtained.

The transported material can be a semiconductor wafer or glass substrate for a flat panel display using the ball table disclosed in the second embodiment of the present invention.

An application example using the ball table disclosed in the present invention to position a glass substrate for a flat panel display will be explained in detail with reference to FIG. 1, which shows the appearance of the main parts of the ball table, and FIG. 2 that shows the internal structure of a ball transfer unit in a broken-out state. The present invention, however, is not limited to this application example. The present invention also includes changes or modifications made based on the concept disclosed in the claims of this specification.

Figure 2:
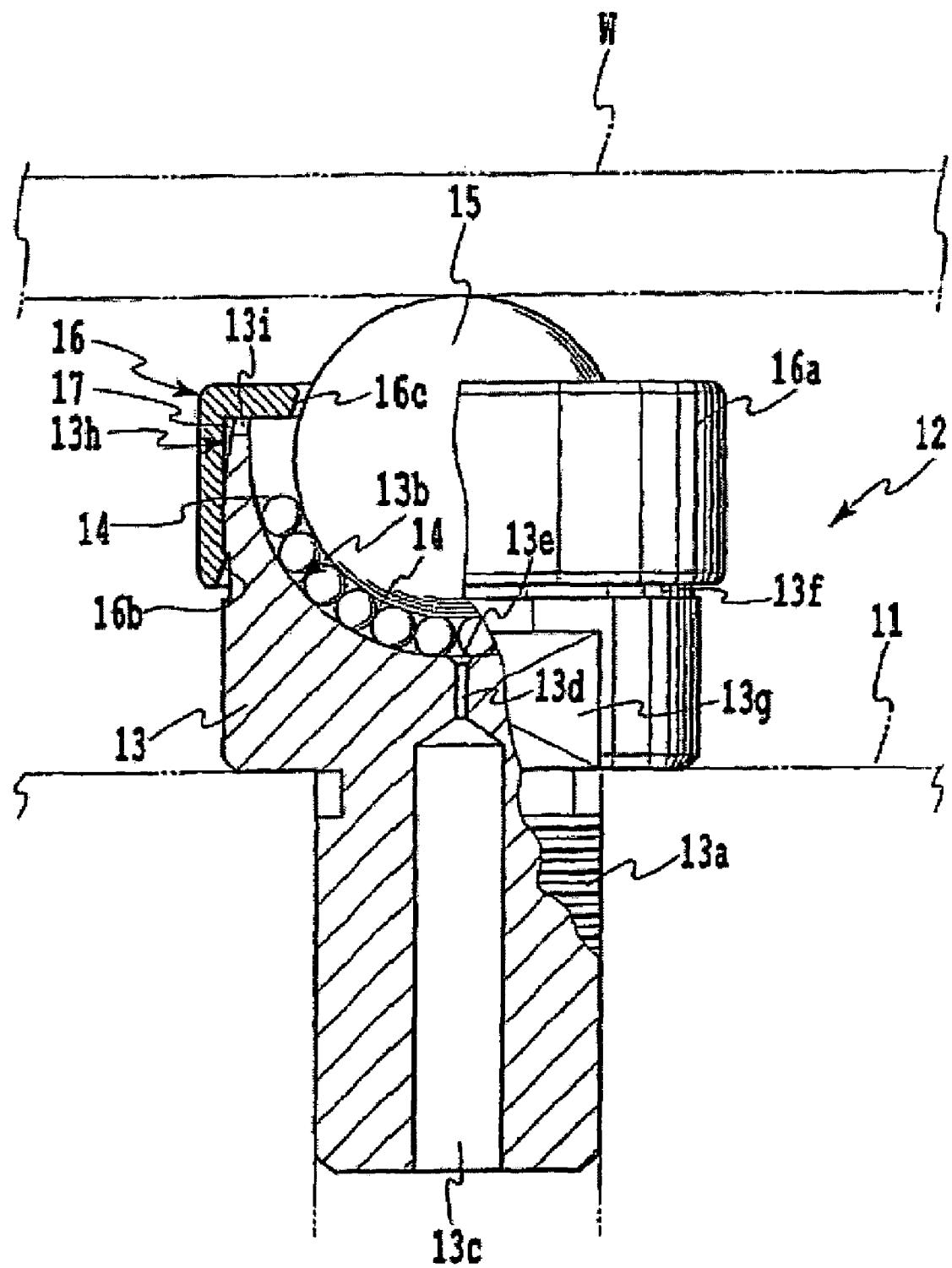
FIG. 2 is a partially cutaway sectional view showing the internal construction in an embodiment of the inventive ball transfer units installed in the ball table shown in FIG. 1.

FIG. 1 show the appearance of the main parts of the ball table disclosed in this application example. FIG. 2 shows the cross-sectional structure of a ball transfer unit assembled in the ball table. Female screw holes, not shown in the figure, are formed at prescribed intervals on the surface of fixed disk 11 used as the support part in the present invention and made of SUS304, etc., treated by means of electroless nickel plating on the surface. A male [-form] screw part 13a that projects downwards from the central part of the main body 13 of a ball transfer unit 12 is screwed as a fastening part into each female [-form] screw hole. A positioning block, not shown in the figure, is fixed on fixed disk 11. When the side end of a glass substrate W transported on fixed disk 11 is slid on fixed disk 11 and is pressed against the positioning block by an actuator, not shown in the figure, the position of glass substrate W can be corrected.

Ball transfer unit 12 used in this application example has a cylindrical main body 13 having a seat surface 13b recessed in a semispherical shape formed in the center at the top, multiple small balls 14 rollingly in contact with the seat surface 13b of main body 13, a large ball 15 rollingly in contact with said multiple small balls 14, and cover 16, which is installed on main body 13 and holds large ball 15 and holds small balls 14 between said large ball 15 and the seat surface 13b of main body 13. These parts are made of a PI (polyimide), such as Vespel (registered trademark) of DuPont, whose Rockwell hardness $H_R R$ is in the range of 110-115 and whose thermal deformation temperature, measured according to test standard ASTM D648, is 360° C. or higher. Both small balls 14 and large ball 15 are mechanically ground to obtain a prescribed sphericity. The seat surface 13b of main body 13 is also mechanically ground to obtain a prescribed radius of curvature. Basically, most of small balls 14 have spot contact with both the seat surface 13b of main body 13 and the outer spherical surface of large ball 15 at the same time. In this way, the frictional resistance can be minimized when glass substrate W is moved from the state in which glass substrate W is carried on large ball 15.

For through hole 13c that penetrates through main body 13 via the central part of male screw part 13a, one end opens on the seat surface 13b of main body 13, while the other end opens on the end surface of male screw part 13a. The opening end of through hole 13c on the side of seat surface 13b becomes small-diameter part 13d whose internal diameter is set to be smaller than the radius of small ball 14, so that the smooth rolling of small ball 14 along seat surface 13b will not be hindered. A chamfer 13e is formed at the opening end facing seat surface 13b. Because of said through hole 13c, when ball transfer unit 12 is used in, for example, a vacuum chamber, the air in ball transfer unit 12 can be evacuated quickly and reliably. Also, when washing glass substrate W, the washing liquid flowing into ball transfer unit 12 can easily be discharged to the outside. Since one end of through hole 13c is opened on seat surface 13b to penetrate through main body 13, the other end of through hole 13c can be opened on the outer peripheral surface of main body 13.

Said male screw part 13a is also made of PI and is integrally formed with main body 13. It is finished by means of mechanical processing. However, it is also possible to use a female screw cylinder instead of male screw part 13a. In this case, the projection height of ball transfer unit 12 from fixed disk 11 can be finely adjusted more easily.

Annular groove 13f, in which securing part 16b formed over the entire inner circle [circumference] at the bottom (lower side in FIG. 2) of cylindrical part 16a of cover 16 having a cup-shaped cross section can be secured, is formed on the outer peripheral surface of cylindrical main body 13. Since male screw part 13a is screwed into the female screw hole on fixed disk 11 to fix main body 13 on fixed disk 11, a pair of planar parts 13g having the so-called width across flats to be held by a spanner or other tool is also formed on the outer peripheral surface of the main part. In this application example, annular groove 13f is formed closer to the top of main body 13 (top in FIG. 2) than said pair of planar parts 13g.

Opening 16c, from which the top part of large ball 15 is projected, is formed in the central part of cover 16. The internal diameter of said opening 16c is set to be smaller than the outer diameter of large ball 15. In the state shown in FIG. 2, when large ball 15 is held on the seat surface 13b of main body 13 via small balls 14, the internal diameter of the opening is set such that [the cover] is not in contact with large ball 15. Also, the internal diameter of the cylindrical part 16a of cover 16 is set such that the cover is fit with a [certain] clearance with respect to the outer diameter of main body 13. The internal diameter of securing part 16b is set to be smaller than the outer diameter of main body 13. Consequently, when the cylindrical part 16a of cover 16 is installed on main body 13, securing part 16b has elastic deformation, and the entire part swells to the outside in the radial direction. The entire securing part returns to its original state when it reaches annular groove 13f. Securing part 16b fits in annular groove 13f so that cover 16 cannot be pulled out from main body 13. In this application example, in order to cause securing part 16b with a diameter smaller than the outer diameter of main body 13 to easily run up on the outer peripheral surface of main body 13, a tapered part 13h with a small tip whose outer diameter is smaller than the internal diameter of securing part 16b is formed at the top of the outer periphery of main body 13, with a notch 13i for ventilation with respect to space 17 encircled by said tapered part 13h and cover 16 being formed in a part on the top surface of main body 13.

When this snapping mechanism is formed by main body 13 and cover 16 as described above, there is no need to use an adhesive, screw, or other independent fixing part when fixing cover 16 on main body 13. Better reliability can be realized.

The height of each ball transfer unit 12 from the surface of fixed disk 11 to the top of the ball transfer unit can be appropriately adjusted by inserting a shim (not shown in the figure) with an appropriate thickness between fixed disk 11 and main body 13 when fixing main body 13 on fixed disk 11.

In the aforementioned application example, the entire ball transfer unit 12 is made of PI. It is also possible to use PAI, PBI, PCTFE, PEEK, PEI, PI, PPS, melamine resin, aromatic polyamide resin, aluminum oxide, zirconium oxide, or silicon nitride. However, when ball transfer unit 12 is used in pretreatment devices for liquid-crystal panel substrate glass, such as an exposure device, plasma dry etcher, vacuum chamber in sputtering device, or heating oven, or at a place exposed to chemicals or when using the ball transfer unit during the cutting of glass or laser repair for correction [of irregularities] after examination, in consideration of the properties of the ball transfer unit, attachment of foreign matter to the transported material, and the manufacturing cost, currently, the best choice is to use PI or PEEK or PBI to form the entire ball transfer unit 12.

When main body 13, small balls, 14, large ball 15, and cover 16 that constitute ball transfer unit 12 are all made of the same material, the washing operation with respect to foreign matter can be simplified. Also, when main body 13, small balls 14, and large ball 15 that are in contact with each other are made of the same material, there is a high possibility of minimizing the static frictional resistance. However, it has been confirmed that even if small balls 14 are made of a stainless steel, such as SUS304, SUS316, SUS420j2, SUS440C, or wet surface-treated (chemical grinding and surface washing) SUS304, SUS316, the metal powder will not attach to the transported material. Even if the metal powder attaches to said transported material, it can be washed off in a later step without any problems.

The ball table of the present invention can support plate-shaped transported material in a clean room, in which the attachment of metal powder or other foreign matter that is difficult to wash off later in the process should be prevented, and can easily adjust the position of the transported material.

The invention claimed is:

1. A ball transfer unit comprising:
    a) a main body having a seat surface recessed in a semispherical shape;
    b) a plurality of small balls which are each in freely rolling contact with the seat surface of the main body,
    c) a large ball which is in freely rolling contact with the plurality of small balls, and
    d) a cover which is attached to the main body and is adapted for holding the large ball and for holding the small balls between the large ball and the seat surface of the main body;
   wherein at least the main body and the large ball are made of a material selected from among PAI, PBI, PCTFE, PEEK, PEI, PI, PPS, melamine resins, aromatic polyamide resins, aluminum oxide, zirconium oxide and silicon nitride; wherein the main body, the small balls, and the large ball each have a Rockwell hardness $H_RR$ of at least 75.

2. The ball transfer unit of claim 1, wherein the main body, the small balls and the large ball each have a heat deflection temperature, according to the ASTM D648 test, of at least 120° C.

3. The ball transfer unit of claim 1, wherein the small balls are formed of the same material as the main body or the large ball.

4. The ball transfer unit of claim 1 wherein the ball transfer unit is made of a single material.

5. The ball transfer unit of claim 4, wherein the single material is PBI, PEEK, or PI.

6. The ball transfer unit of claim 1, wherein the small balls are formed of stainless steel.

7. The ball transfer unit of any one of claims 1, 2, 3, 4, 5 or 6, wherein the main body has an annular groove formed on an outer peripheral surface thereof; and wherein the cover has a tubular portion adapted to fit onto the main body so as to encircle the outer peripheral surface, and also has an annular catch which is formed on an inner peripheral side at a bottom end of the tubular portion, is elastically deformable in the radial direction and can engage the interior of the annular groove, which catch has an inside diameter that is smaller than the outside diameter of the main body.

8. The ball transfer unit of claim 1, further comprising having a through hole that penetrates through the main body wherein one end being opened on the seat surface.

9. A ball table used for supporting a transported material, the ball table being comprised of a plurality of ball transfer units according to any one of claims 1, 2, 3, 4, 5 or 6 and a supporting member in which the ball transfer units are fixed at predetermined intervals.

10. The ball table of claim 9, wherein the transported material is a semiconductor wafer or a glass substrate for a flat panel display.

* * * * *